(12) United States Patent
Feichtinger et al.

(10) Patent No.: US 9,209,619 B2
(45) Date of Patent: Dec. 8, 2015

(54) ESD PROTECTION COMPONENT AND COMPONENT COMPRISING AN ESD PROTECTION COMPONENT AND AN LED

(71) Applicant: EPCOS AG, Munich (DE)

(72) Inventors: Thomas Feichtinger, Graz (AT); Oliver Dernovsek, Lieboch (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 14/351,051

(22) PCT Filed: Oct. 26, 2012

(86) PCT No.: PCT/EP2012/071287
§ 371 (c)(1),
(2) Date: Apr. 10, 2014

(87) PCT Pub. No.: WO2013/060861
PCT Pub. Date: May 2, 2013

(65) Prior Publication Data
US 2014/0252403 A1    Sep. 11, 2014

(30) Foreign Application Priority Data

Oct. 28, 2011 (DE) .......... 10 2011 117 151
Feb. 28, 2012 (DE) .......... 10 2012 101 606

(51) Int. Cl.
| H01L 33/64 | (2010.01) |
|---|---|
| H01L 33/62 | (2010.01) |
| H01L 23/00 | (2006.01) |
| H02H 9/04 | (2006.01) |
| H01C 7/12 | (2006.01) |
| H01L 25/16 | (2006.01) |
| H01L 23/28 | (2006.01) |
| H01L 23/60 | (2006.01) |
| H01L 23/62 | (2006.01) |

(52) U.S. Cl.
CPC . *H02H 9/04* (2013.01); *H01C 7/12* (2013.01); *H01L 25/167* (2013.01); *H01L 33/62* (2013.01); *H01L 33/644* (2013.01); *H01L 23/28* (2013.01); *H01L 23/60* (2013.01); *H01L 23/62* (2013.01); *H01L 33/647* (2013.01); *H01L 2224/16* (2013.01)

(58) Field of Classification Search
CPC .......... H01L 23/28; H01L 23/60; H01L 23/62
See application file for complete search history.

(56) References Cited

U.S. PATENT DOCUMENTS

| 4,811,164 A | 3/1989 | Ling et al. |
|---|---|---|
| 4,882,650 A * | 11/1989 | Maher et al. ............ 361/321.4 |
| 5,324,986 A | 6/1994 | Ueno et al. |

(Continued)

FOREIGN PATENT DOCUMENTS

| DE | 19814388 A1 | 10/1998 |
|---|---|---|
| DE | 19835443 A1 | 3/1999 |

(Continued)

*Primary Examiner* — Ida M Soward
(74) *Attorney, Agent, or Firm* — Slater & Matsil, L.L.P.

(57) ABSTRACT

An ESD protection component includes a ceramic material and a BGA or LGA termination. In addition, an ESD protection component includes a basic body with a lower side. The basic body includes a ceramic material. At least one floating inner electrode is located at a distance from the lower side of two to 100 ceramic grains. Also a component includes a carrier, on which an LED and an ESD protection component are arranged.

15 Claims, 3 Drawing Sheets

(56) References Cited

U.S. PATENT DOCUMENTS

| | | | |
|---|---|---|---|
| 6,011,683 A * | 1/2000 | Dat | 361/306.1 |
| 6,052,272 A * | 4/2000 | Kuroda et al. | 361/303 |
| 6,608,547 B1 * | 8/2003 | Greier et al. | 338/21 |
| 6,700,772 B2 * | 3/2004 | Raghavendra et al. | 361/321.2 |
| 6,760,215 B2 * | 7/2004 | Devoe | 361/303 |
| 7,003,858 B2 * | 2/2006 | Sube et al. | 29/25.35 |
| 7,113,383 B2 * | 9/2006 | Anthony et al. | 361/118 |
| 7,463,474 B2 * | 12/2008 | Ritter et al. | 361/306.1 |
| 7,768,754 B2 * | 8/2010 | Collins et al. | 361/56 |
| 8,263,432 B2 * | 9/2012 | Lien et al. | 438/104 |
| 8,378,455 B2 | 2/2013 | Feichtinger et al. | |
| 8,947,852 B2 * | 2/2015 | Jones et al. | 361/325 |
| 2004/0222433 A1 | 11/2004 | Mazzochette et al. | |
| 2005/0152095 A1 * | 7/2005 | Nakano et al. | 361/321.4 |
| 2005/0184387 A1 | 8/2005 | Collins, III et al. | |
| 2006/0215350 A1 | 9/2006 | Tonogai et al. | |
| 2008/0083929 A1 | 4/2008 | Fan et al. | |
| 2009/0134902 A1 * | 5/2009 | Law | 324/765 |
| 2009/0283898 A1 * | 11/2009 | Janzen et al. | 257/698 |
| 2009/0316374 A1 * | 12/2009 | Palanduz | 361/765 |
| 2011/0038088 A1 * | 2/2011 | Noma et al. | 361/112 |
| 2011/0221037 A1 * | 9/2011 | Engel et al. | 257/537 |
| 2012/0169452 A1 | 7/2012 | Hiehata et al. | |
| 2013/0027155 A1 * | 1/2013 | Feichtinger et al. | 333/185 |
| 2013/0334321 A1 * | 12/2013 | Kato et al. | 235/493 |

FOREIGN PATENT DOCUMENTS

| | | |
|---|---|---|
| DE | 19915661 A1 | 10/1999 |
| DE | 102006057534 A1 | 7/2007 |
| DE | 102007020783 A1 | 11/2008 |
| DE | 102007031510 A1 | 1/2009 |
| DE | 102008024481 A1 | 12/2009 |
| DE | 102009007316 A1 | 8/2010 |
| EP | 2184790 A1 | 5/2010 |
| JP | 2220406 A | 9/1990 |
| JP | 2000228302 A | 8/2000 |
| JP | 2004111914 A | 4/2004 |
| JP | 2006278556 A | 10/2006 |
| JP | 2011523776 A | 8/2011 |
| WO | 2010094795 A1 | 8/2010 |
| WO | 2011040437 a1 | 4/2011 |

\* cited by examiner

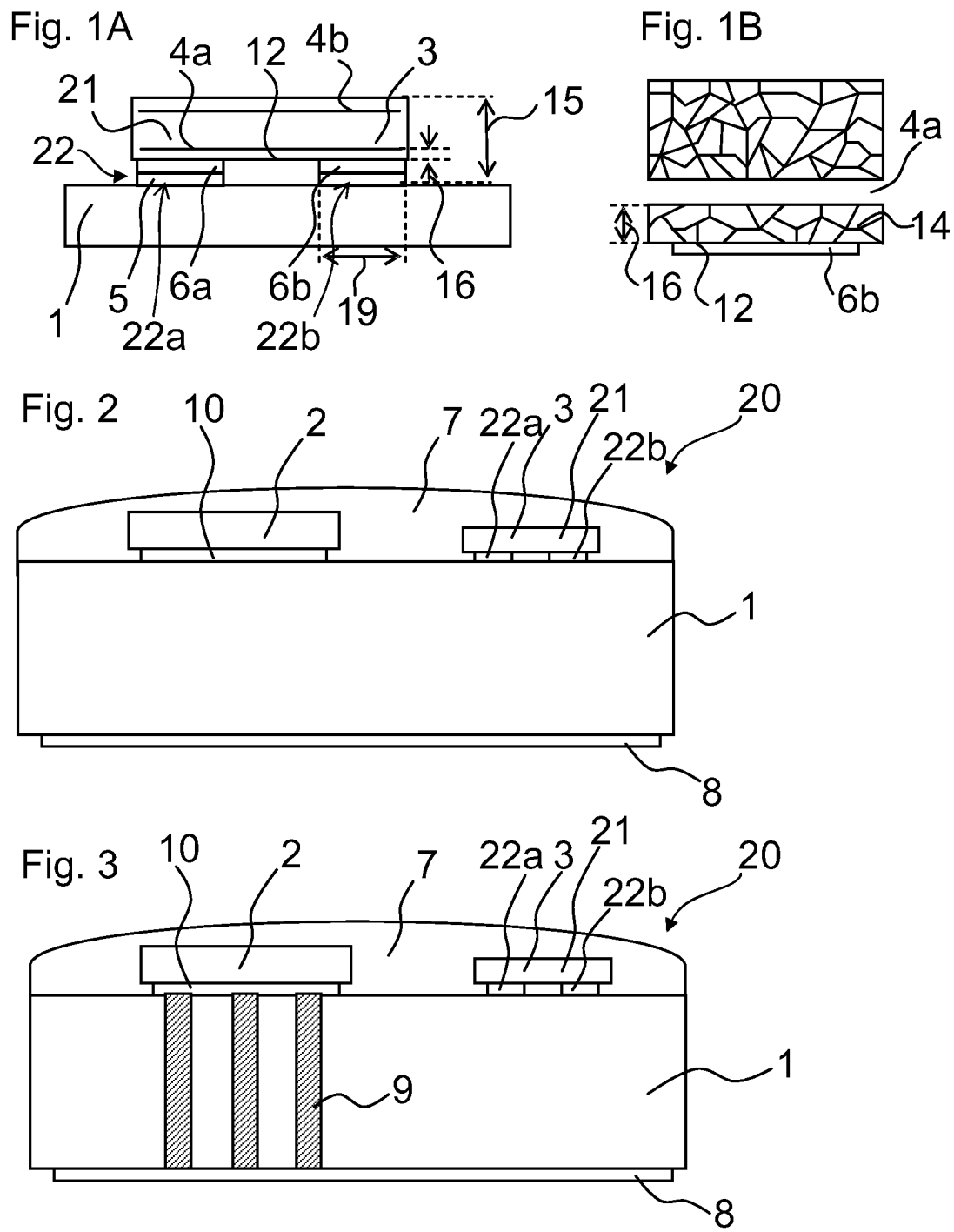

ESD PROTECTION COMPONENT AND COMPONENT COMPRISING AN ESD PROTECTION COMPONENT AND AN LED

This patent application is a national phase filing under section 371 of PCT/EP2012/071287, filed Oct. 26, 2012, which claims the priority of German patent application 10 2011 117 151.0, filed Oct. 28, 2011 and German patent application 10 2012 101 606.2, filed Feb. 28, 2012, each of which is incorporated herein by reference in its entirety.

TECHNICAL FIELD

An ESD protection component is specified. Furthermore, a component which comprises an LED and an ESD protection component is specified.

BACKGROUND

German patent application 10 2008 024 481 A1 discloses an electrical component arrangement which has a semiconductor component and a varistor element for protecting the semiconductor component from electrostatic discharges.

SUMMARY OF THE INVENTION

Embodiments of the invention specify an ESD protection component with improved properties. Further embodiments specify a component comprising an LED and an improved ESD protection component.

An ESD protection component is specified. Preferably, the ESD protection component comprises a ceramic material.

"ESD" in the text below stands for "electrostatic discharge". This means that the ESD protection component is preferably designed to protect other components, for example, semiconductor components, from overvoltages. The ESD protection component can also be used for protecting other components from overcurrent. For example, the ESD protection component is designed for protecting an LED. "LED" in the text which follows stands for "light-emitting diode".

The ESD protection component is preferably in the form of an ultrathin protection component. Preferably, the ESD protection component has a height of between 50 μm and 150 μm, in particular examples between 70 μm and 100 μm. For example, the ESD protection component has a height of 80 μm. Preferably, a component with this height can be installed in a space-saving manner. In addition, in the case of an arrangement of the ESD protection component next to an LED, less shading of the LED occurs the flatter the ESD protection component is.

Preferably, the ceramic material comprises a varistor ceramic or consists of a varistor ceramic.

Preferably, the ceramic material, in particular the varistor ceramic, comprises a ZnO—Bi—Sb material or a ZnO—Pr material or consists of a ZnO—Bi—Sb material or a ZnO—Pr material. With these ceramics, preferably a particularly thin component with a high strength can be achieved.

Preferably, the ceramic of the ESD protection component comprises a composite of a varistor material and a metal or consists of a composite of a varistor material and a metal. For example, the resistance of the varistor ceramic is influenced by the metal.

The ESD protection component preferably has a basic body. The basic body preferably has a lower side. The lower side of the basic body of the ESD protection component is that side which, in a state in which the ESD protection component is mounted on a carrier, faces the carrier. The basic body can comprise a layer stack, in particular a stack of dielectric layers. The dielectric layers preferably comprise the ceramic material. Preferably, the basic body of the ESD protection component is formed by a monolithic sintered body.

Preferably, a contact connection is arranged on the lower side of the basic body. Preferably, the contact connection comprises two contact elements. For example, the contact elements have contact areas. Preferably, the contact elements are designed for electrically contact-connecting the basic body of the ESD protection component, in particular to a printed circuit board.

Preferably, the contact elements are arranged directly on the basic body of the ESD protection component. Preferably, the contact elements are arranged at a distance from one another. Preferably, in the event of overshooting of a voltage present between the contact elements, a current flow can take place through the ESD protection component via the contact elements.

Preferably, the ESD protection component comprises a BGA termination.

"BGA" in the text which follows stands for "ball grid array". In the case of the BGA termination, solder in the form of solder balls, for example, is provided on a component. In the case of the BGA termination, solder material can also be provided in the form of partial balls, for example, hemispherical balls. The BGA termination enables particularly flat soldering of the ESD protection component on a carrier. The solder balls can be provided on the component as early as before soldering of the component, in particular fused onto the component, and thus form part of the component.

Preferably, the BGA termination is arranged on a lower side of the ESD protection component. The solder balls are preferably arranged in structured fashion. For example, the solder balls are arranged in the form of a uniform grid having columns and rows. Preferably, the solder balls are particularly flat.

In an alternative embodiment, the ESD protection component comprises an LGA termination.

"LGA" in the text which follows stands for "land grid array", i.e., a grid array of contact areas. Preferably, the contact areas are arranged in the form of a uniform grid having columns and rows on the ESD protection component. In the case of an LGA termination, too, the ESD protection component can be soldered to a carrier, wherein, in this case, in contrast to the BGA termination, solder material is arranged on the carrier prior to soldering, in particular solder material which has been fused to form solder balls.

One advantage of BGA and LGA terminations consists in that no additional connection pins for soldering a component are required and that the soldering can be particularly flat.

Preferably, the ESD protection component comprises at least one floating inner electrode. The floating inner electrode is not intended for contact connection externally. A floating inner electrode does not extend on any side as far as the outside of a basic body, for example.

Preferably, the floating inner electrode serves to match the breakdown voltage of the ESD protection component. Preferably, there is no further inner electrode located between the floating inner electrode. In the text which follows, such an inner electrode is also referred to as first floating inner electrode. For example, the breakdown voltage is determined inter alia by the distance between the floating inner electrode and the lower side of the basic body of the ESD protection component. Preferably, the breakdown voltage is higher the greater the distance between the floating inner electrode and the lower side of the basic body. Preferably, once the breakdown voltage has been reached, a current flow takes place via the floating inner electrode.

For example, the ESD protection component comprises precisely one floating inner electrode.

In a further embodiment, the ESD protection component comprises precisely two floating inner electrodes. For example, a first and a second floating inner electrode are arranged one above the other. For example, a distance between the second floating inner electrode and the lower side of the basic body of the ESD protection component is greater than a distance between the first floating inner electrode and the lower side of the basic body of the ESD protection component. For example, the second floating inner electrode is primarily used for the symmetry of the component. In particular, the second inner electrode can serve the purpose of preventing a sintering warping of the component, with the result that the component has in particular flat side faces.

In a preferred embodiment, the ESD protection component comprises a basic body with a symmetrical design. Preferably, the basic body has a symmetrical design in terms of the arrangement of the inner electrodes.

Preferably, the basic body, with respect to each floating inner electrode which has a certain distance from the lower side of the basic body, also has a floating inner electrode, which has the same distance from the upper side of the basic body. If the inner electrode runs precisely centrally between the upper and lower sides, no further corresponding inner electrode needs to be provided.

In particular, the basic body can have a symmetrical design with respect to a plane of symmetry which runs parallel to the lower side of the basic body.

In particular, the plane of symmetry runs centrally through the basic body. In this way, it is possible to achieve, for example, a situation in which the basic body is mechanically stable even in the case of a very thin embodiment. For example, the basic body has precisely two, precisely four, or precisely eight floating inner electrodes, wherein the inner electrodes are arranged symmetrically with respect to the plane of symmetry. In a further embodiment, the basic body has an uneven number of inner electrodes, wherein one of the inner electrodes is arranged centrally between the upper and lower sides. Preferably, only the first, i.e., the lowermost, inner electrode contributes to the ESD protection function of the component, while the further inner electrodes are used for mechanical stabilization of the component.

In a further embodiment, the basic body is rotationally symmetrical. For example, the basic body is rotationally symmetrical with respect to an axis of rotation which runs parallel to the lower side and perpendicular to the longitudinal axis of the basic body.

Preferably, a distance between the lower side of the basic body of the ESD protection component and the floating inner electrode, in particular the first floating inner electrode, is two ceramic grains.

In the case of a distance of two grains, this is also referred to as a single grain boundary design. For example, by means of the single grain boundary design, an ultrathin formation of the ESD protection component can be achieved. For example, the distance between the first floating inner electrode and the lower side of the basic body of the ESD protection component is between 7 µm and 10 µm. For example, the distance between the first floating inner electrode and the lower side of the basic body of the ESD protection component is approximately 8 µm.

In a further embodiment, the distance between the first floating inner electrode and the lower side of the basic body is between 2 and 100 ceramic grains.

A distance of clearly more than two ceramic grains, for example, of 80 ceramic grains, makes it possible to use the ESD protection component at relatively high voltages, right up to high-voltage applications.

The active volume which is primarily critical for the functionality of the ESD protection component is preferably located between the lower side of the basic body of the ESD protection component and the first floating inner electrode. The active volume preferably influences the breakdown voltage of the ESD protection component, while a volume above the first floating inner electrode, in particular a second floating inner electrode, does not have any influence on the breakdown voltage.

Preferably, the distance between the first floating inner electrode and an optionally provided second floating inner electrode is greater than the distance between the first floating inner electrode and the lower side of the basic body of the ESD protection component.

In a preferred embodiment, the ESD protection component comprises a basic body comprising a lower side, on which a contact connection is arranged, a first floating inner electrode and, adjacent to this, a second floating inner electrode, wherein the distance between the first floating inner electrode and the second floating inner electrode is greater than the distance between the first floating inner electrode and the lower side of the basic body of the ESD protection component.

In a further preferred embodiment, the ESD protection component comprises a basic body comprising a lower side, wherein the basic body comprises a ceramic material and at least one floating inner electrode, wherein the distance between the lower side of the basic body of the ESD protection component and the floating inner electrode is between two and 100 ceramic grains. Preferably, the distance is two ceramic grains.

In a further preferred embodiment, the ESD protection component comprises a ceramic material and a BGA or LGA termination.

All of the preferred embodiments can include the further above-described features.

Furthermore, a component with a basic body on which an LED and an ESD protection component are arranged is specified. The ESD protection component is preferably designed as described previously.

Preferably, the LED and the ESD protection component are arranged on the basic body of the component. The basic body of the component will also be referred to below as the carrier. Preferably, the LED and the ESD protection component are arranged on an upper side of the basic body. Preferably, the LED and the ESD protection component are arranged at a distance from one another.

By virtue of the ultrathin formation of the ESD protection component, preferably the physical height of the component can be kept low. In particular, the physical height of the LED can be kept low without shading of the LED by the ESD protection component occurring.

The basic body of the component is preferably used as the carrier for the LED and the ESD protection component. Preferably, the basic body acts as heat-dissipating carrier for the LED and the ESD protection component. In addition, the basic body can have electrical contacts for electrically contact-connecting the LED and the ESD protection component.

The basic body of the component preferably comprises a ceramic material or consists of a ceramic material. For example, the basic body comprises an LTCC material, wherein LTCC stands for low temperature co-fired ceramic. Preferably, the basic body comprises at least one of the materials aluminum oxide or aluminum nitride or consists of one of the materials aluminum oxide or aluminum nitride. Alternatively, the basic body comprises an organic material or consists of an organic material. Alternatively, the basic body comprises a metallic material. For example, the basic body comprises one of the materials aluminum or copper. Preferably, the cited materials have good thermal conductivity.

Preferably, the basic body is in the form of an insulating basic body. Preferably, at least part of the basic body is electrically insulating. For example, at least part of the basic body which faces the LED and the ESD protection component is electrically insulating.

By way of example, the basic body comprises a metal, wherein the metal is coated with an electrically insulating layer. For example, the basic body is coated with the electrically insulating layer at least on a side facing the LED and the ESD protection component. For example, the electrically insulating layer comprises aluminum oxide or consists of aluminum oxide. The basic body consisting of a metal and an electrically insulating layer can be considered to be an insulating basic body.

Preferably, the basic body has good thermal conductivity. For example, the basic body can contain metal particles. The thermal conductivity of the basic body can be additionally improved by the metal particles, for example.

The basic body has the shape of a plate, for example.

Preferably, the basic body has at least one via. Via stands for "vertical interconnect access". Preferably, the at least one via runs perpendicular to a surface of the basic body. Preferably, the basic body has a plurality of vias.

Preferably, the basic body has at least one thermal via. Preferably, the at least one thermal via serves to improve thermal conductivity. For example, the basic body comprises a ceramic material and thermal vias or consists of a ceramic material and thermal vias. For example, the basic body comprises an organic material and thermal vias or consists of an organic material and thermal vias. Preferably, heat is dissipated from the LED via the thermal vias. For example, heat is dissipated from the LED to a housing of the component. Preferably, a thermal via improves the thermal conductivity of the LED to a housing and therefore results in an extension of the life of the LED.

Preferably, a metal plating is arranged on a lower side of the basic body of the component. The lower side of the basic body is preferably the side facing away from the LED and the ESD protection component. Preferably, the metal plating serves to electrically contact-connect the component. Preferably, the metal plating is arranged in the form of two contact areas on the lower side. Preferably, the two contact areas are arranged next to one another, at a distance from one another.

Preferably, the basic body has electrical vias. Preferably, the basic body has two electrical vias. Preferably, the electrical vias are used for electrically contact-connecting the LED and the ESD protection component. Preferably, the electrical vias connect the upper side of the basic body to the metal plating on the lower side. Preferably, the electrical vias connect the LED and the ESD protection component directly or indirectly to the metal plating.

In a further embodiment, electrical conductor tracks are arranged on an upper side of the basic body. The electrical conductor tracks can each have profiles with multiple changes of direction or can each be in the form of flat, geometric patterns. They can be arranged on the basic body by means of screen printing, for example. For example, the electrical conductor tracks are in contact with the metal plating on the lower side of the basic body via the electrical vias. Preferably, the electrical conductor tracks connect the LED and the ESD protection component to the metal plating of the basic body of the component via the electrical vias.

For example, the LED and the ESD protection component are contact-connected on the basic body by means of the electrical conductor tracks arranged on the basic body. Alternatively, the LED and the ESD protection component are contact-connected directly to the metal plating via the electrical vias. In this embodiment, no electrical conductor tracks are required. Preferably, the ESD protection component is contact-connected in parallel with the LED.

The LED preferably has a metal plating on its lower side. Preferably, the metal plating of the LED is contact-connected to the electrical conductor tracks applied to the basic body or to an electrical via.

Preferably, the LED and the ESD protection component are arranged on the basic body with a flipchip design. In the case of flipchip mounting, a component is mounted directly on a carrier, without any connecting wires, with a contact-connection side on the bottom. The contact-connection side is the side on which the contact connection provided for electrically contact-connecting the component is arranged, in particular the lower side of the component. Preferably, a BGA or LGA termination is arranged on the contact-connection side. Preferably, the BGA or LGA termination enables a mechanical and electrical connection of the LED and the ESD protection component to the basic body with a flipchip design.

Preferably, the LED comprises at least one of the following materials: gallium phosphide (GaP), gallium nitride (GaN), gallium arsenic phosphide (GaAsP), aluminum gallium indium phosphide (AlGaInP), aluminum gallium phosphide (AlGaP), aluminum gallium arsenide (AlGaAs), indium gallium nitride (InGaN), aluminum nitride (AlN), aluminum gallium nitride (AlGaN), aluminum gallium indium nitride (AlGaInN) or zinc selenide (ZnSe).

The ESD protection component is preferably used for protecting the LED from overvoltages. Preferably, the ESD protection component has a resistance which decreases significantly above a breakdown voltage, with the result that, in the event of an overvoltage, a current can be dissipated via the ESD protection component. In particular, the resistance of the ESD protection component is such that the risk of damage to the LED as a result of an overvoltage is reduced. For example, the breakdown voltage of the ESD protection component is between 7 V and 8 V. Preferably, the breakdown voltage of between 7 V and 8 V can be achieved by the single grain boundary design.

In a further embodiment, the component has a thermal sensor. Preferably, the thermal sensor is interconnected with the LED. For example, the thermal sensor has NTC properties. "NTC" stands for "negative temperature coefficient". That is to say that the thermal sensor conducts current better at high temperatures than at low temperatures.

Preferably, the thermal sensor contributes to the regulation of a control current of the LED, with the result that said LED can be operated gently. The regulation of the control current is preferably performed in such a way that the LED is not subjected to any current surges or is operated on an alternating current which is as constant as possible.

In a further embodiment, the component has an overcurrent protection means. Preferably, the overcurrent protection means is interconnected with the LED. For example, the overcurrent protection means has PTC properties. "PTC" stands for "positive temperature coefficient". That is to say that the overcurrent protection means conducts current better at low temperatures than at high temperatures.

BRIEF DESCRIPTION OF THE DRAWINGS

An ESD protection component and various arrangements with an LED and an ESD protection component will be explained below with reference to schematic figures, which are not true to scale.

FIG. 1A shows an ESD protection component on a carrier in a sectional illustration;

FIG. 1B shows a detail of the ESD protection component from FIG. 1A in a sectional illustration;

FIG. 2 shows a component with an LED and an ESD protection component as shown in FIG. 1A on a carrier in a sectional illustration;

FIG. 3 shows a component with an LED and an ESD protection component as shown in FIG. 1A on a carrier with thermal vias in the carrier in a sectional illustration;

DETAILED DESCRIPTION OF ILLUSTRATIVE EMBODIMENTS

Figure 4:
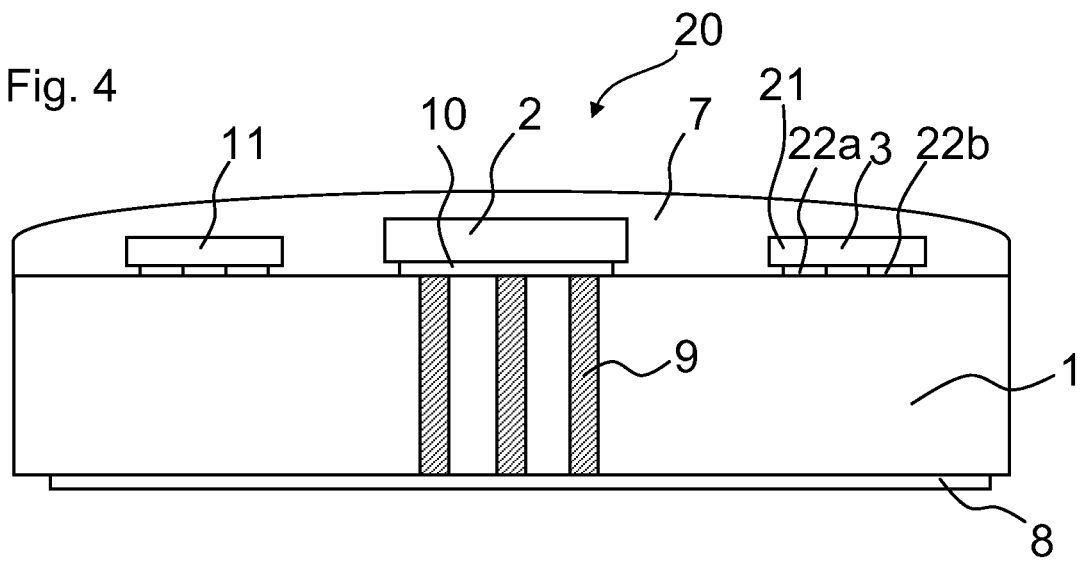
FIG. 4 shows a component with an LED, an ESD protection component and a thermal sensor on a carrier with thermal vias in the carrier in a sectional illustration.

FIG. 1A shows an ESD protection component 3 for protecting against electrostatic discharges. The ESD protection component 3 is arranged on a carrier 1. The ESD protection component 3 comprises a ceramic material. For example, the ESD protection component 3 comprises a ZnO—Pr material. ZnO—Pr has a high strength, and therefore very thin, planar components can be produced with a ZnO—Pr material. Alternatively, the ESD protection component 3 can have, for example, a ZnO—Bi—Sb material.

The ESD protection component 3 has a basic body 21 with a lower side 12. The lower side 12 of the ESD protection component 3 is preferably a side facing the carrier 1. The carrier 1 is preferably a basic body of a component.

Two floating inner electrodes 4a, 4b are arranged one above the other in the basic body 21 of the ESD protection component 3. The floating inner electrodes 4a, 4b do not extend as far as an outer side of the ESD protection component 3 on any side. The floating inner electrodes 4a, 4b preferably comprise a metallic material, for example, they comprise silver palladium or consist of silver palladium.

A contact connection in the form of a BGA termination 22 is arranged on the lower side 12 of the ESD protection component 3. The BGA termination 22 comprises two contact elements 22a, 22b. The contact elements 22a, 22b have contact areas 6a, 6b. The contact areas 6a, 6b comprise, for example, the materials Cu/Ni/Au, Cr/Ni/Au or Cr/Cu/Ni/Au or consist of these materials. For example, a contact area 6a, 6b has a width 19 of 200 µm. For example, a contact area 6a, 6b has a depth of 150 µm.

Prior to soldering of the ESD protection component 3, solder balls for soldering the ESD protection component 3 are applied to the contact areas 6a, 6b of the ESD protection component 3. FIG. 1A shows the ESD protection component after soldering to a carrier 1, wherein the solder balls are fused to form a solder layer 5. The BGA termination 22 can comprise an SnAu solder material, for example.

Alternatively, the ESD protection component can comprise an LGA termination. In this case, no solder material is applied to the contact areas 6a, 6b of the ESD protection component prior to the soldering. The solder material is applied to the carrier 1 prior to soldering and fused in the case of the LGA termination.

A distance 16 between the first, lower floating inner electrode 4a and the lower side 12 of the ESD protection component 3 is 7 µm to 10 µm, for example. For example, the distance 16 is 8 µm. This corresponds to a distance of two ceramic grains, in particular of two ZnO—Pr grains. This is also referred to as a single grain boundary design since only one grain boundary is located between the first floating inner electrode 4a and the lower side 12 of the basic body 21 of the ESD protection component 3. Depending on the desired voltage range, the distance can also be greater than two ceramic grains, for example, ten ceramic grains.

By virtue of the single grain boundary design, an ultrathin design of the ESD protection component 3 can be realized. The physical height 15 of the ESD protection component 3 is preferably 50 µm to 150 µm, particularly preferably 70 µm to 100 µm, including the BGA termination 22. For example, the physical height 15 of the ESD protection component 3, including the BGA termination 22, is 80 µm.

An active volume of the ESD protection component 3 is located between the first floating inner electrode 4a and the lower side 12 of the basic body 21 of the ESD protection component 3. The active volume is critical for the functionality of the ESD protection component 3. The distance 16 between the first floating inner electrode 4a and the lower side 12 in combination with the properties of the ceramic material used determines, critically, the breakdown voltage of the ESD protection component. A distance 16 of two ceramic grains corresponds to a breakdown voltage of between 7 V and 8 V, for example. For example, a distance 16 of two ZnO—Pr grains corresponds to a breakdown voltage of 7.2 V. When the breakdown voltage is reached, the resistance of the ESD protection component 3 preferably decreases, with the result that, for example, an overcurrent occurring can be dissipated via the ESD protection component 3.

The ceramic material arranged over the first floating inner electrode 4a and the upper, second floating inner electrode 4b preferably merely serve to provide the symmetry of the component. As a result of this symmetrical formation of the ESD protection component 3, it is preferably the case that the ESD protection component 3 warps less during sintering than in the case of an asymmetrical formation and that the mechanical stability of the ESD protection component 3 is increased. The region which is located above the first floating inner electrode 4a preferably does not have any ESD functionality or only a low level of ESD functionality in the ESD protection component 3.

The carrier 1 comprises, for example, a ceramic material or consists of a ceramic material. For example, the carrier 1 comprises aluminum oxide or aluminum nitride or consists of aluminum oxide or aluminum nitride. Alternatively, the carrier 1 comprises an organic material or consists of a ceramic material. Preferably, the carrier 1 has a high thermal conductivity. For example, the carrier 1 is in the form of an insulating carrier. For example, at least part of the carrier 1 is insulating. For example, at least part of the carrier 1, which faces the ESD protection component 3, is insulating.

Electrical conductor tracks (not illustrated) for contact-connecting the ESD protection component 3 are arranged on the carrier 1, for example.

FIG. 1B shows an enlarged detail of an ESD protection component 3 as shown in FIG. 1A in a sectional illustration.

This detail shows schematically the grain boundaries of the ceramic material. The distance 16 between the lower side 12 of the ESD protection component 3 and the first floating inner electrode 4a is 8 μm, for example. This distance 16 corresponds to the grain size of two ceramic grains. This results in a single grain boundary layer 14 between the lower side 12 and the first floating inner electrode 4a. For example, the ESD protection component 3 can be formed so as to be ultrathin by virtue of the single grain boundary design. In the detail shown, the solder balls which are arranged on the contact area 6b in the case of the BGA termination are not shown.

FIG. 2 shows a component 20, wherein an LED 2 and an ESD protection component 3 designed as shown in FIG. 1 are arranged on a carrier 1. The carrier 1 is also referred to as basic body of the component 20. Owing to the ultrathin design of the ESD protection component 3, no or only little shading of the LED 2 by the ESD protection component 3 occurs. As a result, the LED 2 can also have a flat design, with the result that the physical height of the component 20 can be kept low.

The LED 2 and the ESD protection component 3 are arranged on the carrier 1 in a flipchip design, for example. In the case of the flipchip design, components are mounted directly, without any further connecting wires, on a basic body. This results in small dimensions of the arrangement and short conductor lengths. The LED 2 is in contact with electrical conductor tracks (not illustrated) of the carrier 1, for example, via a metal contact 10. The ESD protection component 3 is soldered to the carrier 1 by means of a BGA or LGA termination having contact elements 22a, 22b.

The carrier 1 preferably comprises a material which has a high thermal conductivity. For example, the carrier 1 comprises a ceramic material, a metallic material or an organic material. For example, the basic body consists of a ceramic material or an organic material. For example, the basic body comprises aluminum oxide or aluminum nitride or consists of aluminum oxide or aluminum nitride. A metal plating 8 is applied to the lower side of the carrier 1. The metal plating 8 serves to electrically connect the component 20.

Owing to the thermal conductivity of the carrier 1, heat dissipation from the LED 2 to a housing (not illustrated) can take place. As a result of reduced thermal loading, the life of an LED can be extended. At an operating temperature of an LED which is reduced by 20° C., the life of the LED can be increased by a factor of 2, for example.

A protective coating 7 is applied over the LED 2 and the ESD protection component 3.

FIG. 3 shows a similar arrangement to that shown in FIG. 2 of an LED 2 and an ESD protection component 3 with a formation as shown in FIG. 1 on a carrier 1. In addition, in the exemplary embodiment shown in FIG. 3, thermal vias 9 are arranged in the carrier 1. For example, a plurality of, for example, three, thermal vias are arranged in the carrier 1. The thermal vias 9 lead from the LED 2 to the metal plating 8 applied to the lower side of the carrier 1. The thermal vias 9 comprise, for example, silver, copper or silver palladium or consist of silver, copper or silver palladium. By virtue of the use of these thermal vias 9, better heat dissipation from the LED 2 to a housing can be achieved.

FIG. 4 shows a further exemplary embodiment of a component 20, wherein an LED 2, an ESD protection component 3 and a plurality of thermal vias 9 are arranged similar to the manner described in FIG. 3. In addition, a thermal sensor 11 is arranged on the carrier 1. The thermal sensor 11 is in the form of an NTC element, for example, i.e., it conducts current better at high temperatures than at low temperatures. The thermal sensor 11 is preferably used for regulating the control current, with the result that the LED is not subject to any current surges. Prior to being switched on, said thermal sensor is cold and therefore conducts poorly and reduces the inrush current. Once it has been switched on, it is heated by the current flow and loses its high initial resistance.

In addition or as an alternative, an overcurrent protection means can be arranged on the carrier 1 (not illustrated). The overcurrent protection means is in the form of a PTC element, for example, i.e., it conducts current better at low temperatures than at high temperatures. A protective coating 7 is applied over the components.

Figure 5:
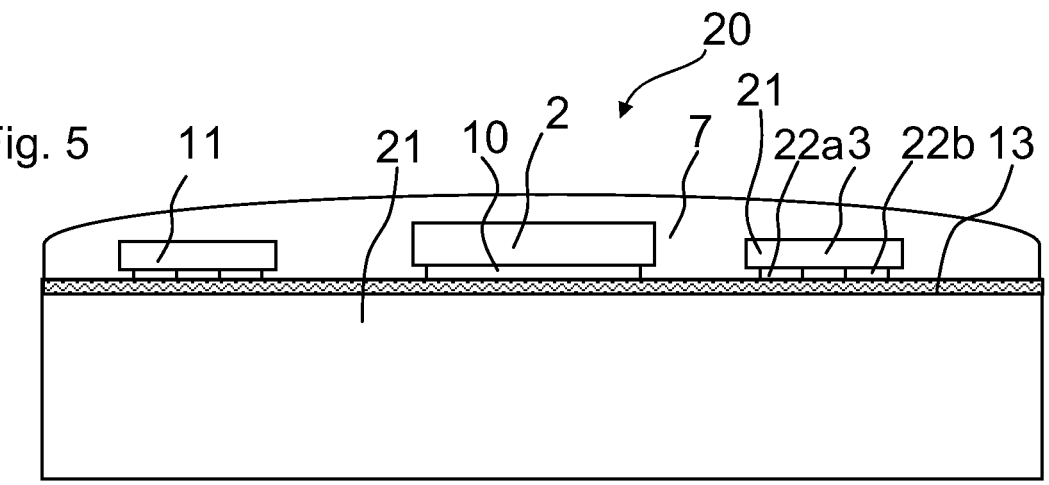
FIG. 5 shows a component with an LED, an ESD protection component and a thermal sensor on a metallic carrier in a sectional illustration.

FIG. 5 shows an exemplary embodiment of a component 20, wherein an LED 2, an ESD protection component 3 and a thermal sensor 11 are arranged on a carrier 1. The carrier 1 is also referred to as the basic body of the component 20. The thermal sensor 11 is in the form of an NTC element, for example.

The basic body 21 comprises, for example, a metallic material. The carrier 1 is coated with an electrically insulating layer 13 on a side which faces the LED 2 and the ESD protection component 3. Therefore, the carrier 1 can be considered to be an insulating basic body. The carrier 1 comprises aluminum or copper, for example. The electrically insulating layer 13 comprises a ceramic insulation layer, for example, or consists of a ceramic insulation layer. The electrically insulating layer 13 comprises aluminum oxide or aluminum nitride, for example, or consists of aluminum oxide or aluminum nitride. Preferably, electrical conductor tracks (not illustrated) for contact-connecting the components of the LED 2, of the ESD protection component 3 and the thermal sensor 11 are arranged on the electrically insulating layer 13. Preferably, heat can be dissipated from the components to a housing particularly well via a metallic part of the carrier 1.

In addition or as an alternative, an overcurrent protection means can be arranged on the carrier 1 (not illustrated). A protective coating 7 is applied over the components.

Figure 6:
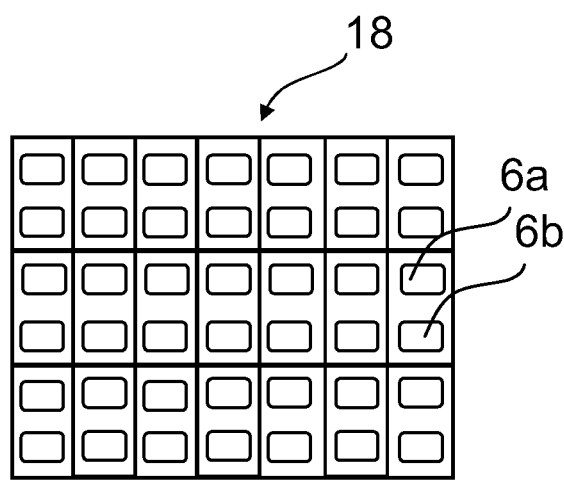
FIG. 6 shows a wafer for producing ESD protection components as shown in FIG. 1A.

FIG. 6 shows a wafer 18, which is used as substrate for producing electronic component parts. The wafer 18 shown in FIG. 6 is used for producing ESD protection components. A plurality of ESD protection components can be produced from one wafer. The ESD protection components are formed as shown in FIG. 1, for example. In this case, contact areas 6a, 6b are applied to the wafer 18 at uniform distances in the manner of a chessboard. The contact areas 6a, 6b are applied, for example, by means of masking technology or stencil printing.

In the case of a BGA termination, solder balls are applied to the contact areas 6a, 6b. In the case of an LGA termination, solder balls are applied to the carrier preferably prior to soldering. The solder balls are, for example, between 100 nm and 200 μm high. For example, ESD protection components as shown in FIG. 1 are produced from the wafer 18.

The invention claimed is:

1. An ESD protection component comprising:
 a basic body with a lower side, wherein the basic body comprises a ceramic material; and
 a floating inner electrode, wherein a distance between the lower side and the floating inner electrode is 2 to 100 ceramic grains.

2. The ESD protection component according to claim 1, wherein the distance is 2 ceramic grains.

3. The ESD protection component according to claim 1, further comprising a ball grid array or land grid array termination.

4. The ESD protection component according to claim 1, further comprising a second floating inner electrode, wherein a distance between the floating inner electrode and the second floating inner electrode is greater than the distance between the floating inner electrode and the lower side of the basic body.

5. The ESD protection component according to claim 1, further comprising a contact connection for electrically contact-connecting the basic body, wherein the contact connection is arranged on the lower side of the basic body.

6. The ESD protection component according to claim 1, wherein the basic body is formed symmetrically with respect to a plane that runs parallel to the lower side of the basic body.

7. The ESD protection component according to claim 1, wherein the ceramic material comprises a ZnO—Bi—Sb material or ZnO—Pr material.

8. A component comprising:
 a carrier;
 an LED arranged on the carrier; and
 the ESD protection component according to claim 1, the ESD protection component being arranged on the carrier.

9. The component according to claim 8, wherein the carrier comprises a ceramic material or an organic material.

10. The component according to claim 8, wherein the carrier has a thermal via that runs perpendicular to a surface of the carrier, the thermal via thermally coupled between the LED and a housing.

11. The component according to claim 8, wherein the carrier comprises a metal, wherein the metal is coated with an electrically insulating layer.

12. An ESD protection component comprising:
 a basic body with a lower side;
 a first floating inner electrode;
 a second floating inner electrode adjacent to the first floating inner electrode, wherein a distance between the first floating inner electrode and the second floating inner electrode is greater than a distance between the first floating inner electrode and the lower side of the basic body, and wherein the first and second floating inner electrodes are not designed for an external contact connection; and
 a contact connection arranged on the lower side of the basic body.

13. The ESD protection component according to claim 12, wherein the basic body comprises a ZnO—Bi—Sb material or ZnO—Pr material.

14. The ESD protection component according to claim 12, wherein a distance between the lower side and the first floating inner electrode is 2 to 100 ceramic grains.

15. The ESD protection component according to claim 12, wherein the basic body is formed symmetrically with respect to a plane that runs parallel to the lower side of the basic body.

* * * * *